(12) United States Patent
Knaepen et al.

(10) Patent No.: US 10,551,741 B2
(45) Date of Patent: Feb. 4, 2020

(54) METHOD OF FORMING A DIRECTED SELF-ASSEMBLED LAYER ON A SUBSTRATE

(71) Applicants: ASM IP HOLDING B.V., Almere (NL); IMEC VZW, Leuven (BE)

(72) Inventors: Werner Knaepen, Leuven (BE); Jan Willem Maes, Wilrijk (BE); Maarten Stokhof, Winksele (BE); Roel Gronheid, Huldenberg (BE); Hari Pathangi Sriraman, Leuven (BE)

(73) Assignees: ASM IP HOLDING B.V., Almere (NL); IMEC vzw, Leuven (BE)

( * ) Notice: Subject to any disclaimer, the term of this patent is extended or adjusted under 35 U.S.C. 154(b) by 0 days.

(21) Appl. No.: 16/094,119

(22) PCT Filed: Apr. 7, 2017

(86) PCT No.: PCT/US2017/026518
§ 371 (c)(1),
(2) Date: Oct. 16, 2018

(87) PCT Pub. No.: WO2017/184357
PCT Pub. Date: Oct. 26, 2017

(65) Prior Publication Data
US 2019/0155159 A1    May 23, 2019

Related U.S. Application Data

(60) Provisional application No. 62/324,255, filed on Apr. 18, 2016.

(51) Int. Cl.
*G03F 7/16* (2006.01)
*H01L 21/027* (2006.01)
(Continued)

(52) U.S. Cl.
CPC ............ *G03F 7/168* (2013.01); *B05D 3/0254* (2013.01); *B05D 3/04* (2013.01); *B05D 3/0486* (2013.01);
(Continued)

(58) Field of Classification Search
CPC . H01L 21/027; H01L 21/76841; H01L 21/31; H01L 21/469; H01L 51/0018;
(Continued)

(56) References Cited

U.S. PATENT DOCUMENTS

| 4,863,879 A | 9/1989 | Kwok |
|---|---|---|
| 4,948,755 A | 8/1990 | Mo |

(Continued)

FOREIGN PATENT DOCUMENTS

| EP | 0469456 A1 | 2/1992 |
|---|---|---|
| EP | 0880168 A2 | 11/1998 |

(Continued)

OTHER PUBLICATIONS

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

(Continued)

*Primary Examiner* — William P Fletcher, III
(74) *Attorney, Agent, or Firm* — Knobbe Martens Olson & Bear, LLP

(57) ABSTRACT

A method of forming a directed self-assembled (DSA) layer on a substrate by: providing a substrate; applying a layer comprising a self-assembly material on the substrate; and annealing of the self-assembly material of the layer to form a directed self-assembled layer by providing a controlled temperature and gas environment around the substrate. The controlled gas environment comprises molecules compris- (Continued)

ing an oxygen element with a partial pressure between 10-2000 Pa.

24 Claims, 2 Drawing Sheets

(51) Int. Cl.
H01L 21/67 (2006.01)
H01L 21/768 (2006.01)
H01L 51/00 (2006.01)
H01L 21/469 (2006.01)
H01L 21/31 (2006.01)
B05D 3/04 (2006.01)
B05D 3/02 (2006.01)

(52) U.S. Cl.
CPC ............ *H01L 21/027* (2013.01); *H01L 21/31* (2013.01); *H01L 21/469* (2013.01); *H01L 21/67098* (2013.01); *H01L 21/67155* (2013.01); *H01L 21/67161* (2013.01); *H01L 21/67167* (2013.01); *H01L 21/67207* (2013.01); *H01L 21/76841* (2013.01); *H01L 51/0018* (2013.01); *B05D 2203/30* (2013.01); *H01L 2224/0362* (2013.01); *H01L 2224/11622* (2013.01); *H01L 2224/27622* (2013.01)

(58) Field of Classification Search
CPC ... H01L 2224/0362; H01L 2224/11622; H01L 2224/27622; H01L 21/67098; H01L 21/67155; H01L 21/67161; H01L 21/67167; H01L 21/67207; B05D 3/0254; B05D 3/04; B05D 3/0486; B05D 2203/30
See application file for complete search history.

(56) References Cited

U.S. PATENT DOCUMENTS

| | | | |
|---|---|---|---|
| 5,288,697 A | 2/1994 | Schrepp et al. | |
| 5,447,887 A | 9/1995 | Filipiak et al. | |
| 5,633,036 A | 5/1997 | Seebauer et al. | |
| 5,869,135 A | 2/1999 | Vaeth et al. | |
| 5,925,494 A | 7/1999 | Horn | |
| 6,046,108 A | 4/2000 | Liu et al. | |
| 6,482,740 B2 | 11/2002 | Soininen et al. | |
| 6,586,330 B1 | 7/2003 | Ludviksson et al. | |
| 6,679,951 B2 | 1/2004 | Soininen et al. | |
| 6,759,325 B2 | 7/2004 | Raaijmakers et al. | |
| 6,811,448 B1 | 11/2004 | Paton et al. | |
| 6,844,258 B1 | 1/2005 | Fair et al. | |
| 6,878,628 B2 | 4/2005 | Sophie et al. | |
| 6,887,795 B2 | 5/2005 | Soininen et al. | |
| 6,921,712 B2 | 7/2005 | Soininen et al. | |
| 6,958,174 B1 | 10/2005 | Klaus et al. | |
| 7,067,407 B2 | 6/2006 | Kostamo et al. | |
| 7,084,060 B1 | 8/2006 | Furukawa et al. | |
| 7,118,779 B2 | 10/2006 | Verghese et al. | |
| 7,220,669 B2 | 5/2007 | Hujanen et al. | |
| 7,241,677 B2 | 7/2007 | Soininen et al. | |
| 7,323,411 B1 | 1/2008 | Blosse | |
| 7,405,143 B2 | 7/2008 | Leinikka et al. | |
| 7,425,350 B2 | 9/2008 | Todd | |
| 7,476,618 B2 | 1/2009 | Kilpela et al. | |
| 7,494,927 B2 | 2/2009 | Kostamo et al. | |
| 7,595,271 B2 | 9/2009 | White | |
| 7,754,621 B2 | 7/2010 | Putkonen | |
| 7,799,135 B2 | 9/2010 | Verghese et al. | |
| 7,910,177 B2 | 3/2011 | Li | |
| 7,914,847 B2 | 3/2011 | Verghese et al. | |
| 7,927,942 B2 | 4/2011 | Raaijmakers | |
| 7,955,979 B2 | 6/2011 | Kostamo et al. | |
| 7,964,505 B2 | 6/2011 | Khandelwal et al. | |
| 8,293,597 B2 | 10/2012 | Raaijmakers | |
| 8,293,658 B2 | 10/2012 | Shero et al. | |
| 8,425,739 B1 | 4/2013 | Wieting | |
| 8,536,058 B2 | 9/2013 | Kostamo et al. | |
| 8,778,815 B2 | 7/2014 | Yamaguchi et al. | |
| 8,890,264 B2 | 11/2014 | Dewey et al. | |
| 8,956,971 B2 | 2/2015 | Haukka et al. | |
| 8,962,482 B2 | 2/2015 | Albertson et al. | |
| 8,980,418 B2 | 3/2015 | Darling et al. | |
| 8,993,404 B2 | 3/2015 | Kobrinsky et al. | |
| 9,067,958 B2 | 6/2015 | Romero | |
| 9,112,003 B2 | 8/2015 | Haukka et al. | |
| 9,129,897 B2 | 9/2015 | Pore et al. | |
| 9,136,110 B2 | 9/2015 | Rathsack | |
| 9,159,558 B2 | 10/2015 | Cheng et al. | |
| 9,236,292 B2 | 1/2016 | Romero et al. | |
| 9,257,303 B2 | 2/2016 | Haukka et al. | |
| 9,490,145 B2 | 11/2016 | Niskanen et al. | |
| 9,502,289 B2 | 11/2016 | Haukka et al. | |
| 9,803,277 B1 | 10/2017 | Longrie et al. | |
| 9,911,595 B1 | 3/2018 | Smith et al. | |
| 10,204,782 B2 | 2/2019 | Maes et al. | |
| 10,373,820 B2 | 8/2019 | Tois et al. | |
| 2001/0019803 A1 | 9/2001 | Mirkanimi | |
| 2001/0025205 A1* | 9/2001 | Chern | C23C 16/34 700/121 |
| 2002/0047144 A1 | 4/2002 | Nguyen et al. | |
| 2002/0068458 A1 | 6/2002 | Chiang et al. | |
| 2002/0090777 A1 | 7/2002 | Forbes et al. | |
| 2003/0027431 A1 | 2/2003 | Sneh et al. | |
| 2003/0066487 A1 | 4/2003 | Suzuki | |
| 2003/0143839 A1 | 7/2003 | Raaijmakers et al. | |
| 2003/0181035 A1 | 9/2003 | Yoon et al. | |
| 2003/0192090 P1 | 10/2003 | Meilland | |
| 2003/0193090 A1 | 10/2003 | Otani et al. | |
| 2004/0219746 A1 | 11/2004 | Vaartstra et al. | |
| 2005/0136604 A1 | 6/2005 | Al-Bayati et al. | |
| 2005/0223989 A1 | 10/2005 | Lee et al. | |
| 2006/0019493 A1 | 1/2006 | Li | |
| 2006/0047132 A1 | 3/2006 | Shenai-Khatkhate et al. | |
| 2006/0141155 A1 | 6/2006 | Gordon et al. | |
| 2006/0156979 A1 | 7/2006 | Thakur et al. | |
| 2006/0199399 A1 | 9/2006 | Muscat | |
| 2006/0226409 A1 | 10/2006 | Burr et al. | |
| 2006/0292845 A1* | 12/2006 | Chiang | H01L 21/32051 438/597 |
| 2007/0063317 A1 | 3/2007 | Kim et al. | |
| 2007/0099422 A1 | 5/2007 | Wijekoon et al. | |
| 2007/0241390 A1 | 10/2007 | Tanaka et al. | |
| 2008/0066680 A1 | 3/2008 | Sherman | |
| 2008/0072819 A1 | 3/2008 | Rahtu | |
| 2008/0179741 A1 | 7/2008 | Streck et al. | |
| 2008/0241575 A1 | 10/2008 | Lavoie et al. | |
| 2008/0282970 A1 | 11/2008 | Heys et al. | |
| 2009/0035949 A1 | 2/2009 | Niinisto et al. | |
| 2009/0071505 A1 | 3/2009 | Miya et al. | |
| 2009/0081385 A1 | 3/2009 | Heys et al. | |
| 2009/0203222 A1 | 8/2009 | Dussarrat et al. | |
| 2009/0269507 A1 | 10/2009 | Yu et al. | |
| 2009/0274887 A1 | 11/2009 | Millward et al. | |
| 2009/0275163 A1 | 11/2009 | Lacey et al. | |
| 2009/0311879 A1 | 12/2009 | Blasco et al. | |
| 2010/0015756 A1 | 1/2010 | Weidman et al. | |
| 2010/0147396 A1 | 6/2010 | Yamagishi et al. | |
| 2010/0178468 A1 | 7/2010 | Jiang et al. | |
| 2010/0248473 A1 | 9/2010 | Ishizaka et al. | |
| 2010/0270626 A1 | 10/2010 | Raisanen | |
| 2011/0039420 A1 | 2/2011 | Nakao et al. | |
| 2011/0053800 A1 | 3/2011 | Jung et al. | |
| 2011/0124192 A1 | 5/2011 | Ganguli et al. | |
| 2011/0221061 A1 | 9/2011 | Prakash | |
| 2011/0311726 A1 | 12/2011 | Liu et al. | |
| 2012/0032311 A1 | 2/2012 | Gates | |
| 2012/0046421 A1 | 2/2012 | Darling et al. | |
| 2012/0088369 A1 | 4/2012 | Weidman et al. | |
| 2012/0189868 A1 | 7/2012 | Borovik et al. | |
| 2012/0219824 A1 | 8/2012 | Prolier et al. | |
| 2012/0264291 A1 | 10/2012 | Ganguli et al. | |
| 2012/0269970 A1 | 10/2012 | Ido et al. | |
| 2013/0005133 A1 | 1/2013 | Lee et al. | |

(56) References Cited

U.S. PATENT DOCUMENTS

| | | |
|---|---|---|
| 2013/0089983 A1 | 4/2013 | Sugita et al. |
| 2013/0095664 A1 | 4/2013 | Matero et al. |
| 2013/0115768 A1 | 5/2013 | Pore et al. |
| 2013/0146881 A1 | 6/2013 | Yamazaki et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1* | 11/2013 | Rathsack ............ G03F 7/0002 428/195.1 |
| 2013/0316080 A1 | 11/2013 | Yamaguchi et al. |
| 2014/0001572 A1 | 1/2014 | Bohr et al. |
| 2014/0024200 A1* | 1/2014 | Kato ............ H01L 21/02617 438/473 |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0273290 A1* | 9/2014 | Somervell ............ H01L 22/12 438/5 |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004806 A1 | 1/2015 | Ndiege et al. |
| 2015/0011032 A1 | 1/2015 | Kunimatsu et al. |
| 2015/0037972 A1 | 2/2015 | Danek et al. |
| 2015/0064931 A1 | 3/2015 | Kumagai et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0299848 A1 | 10/2015 | Haukka et al. |
| 2015/0371866 A1 | 12/2015 | Chen et al. |
| 2015/0376211 A1 | 12/2015 | Girard et al. |
| 2016/0075884 A1 | 3/2016 | Chen |
| 2016/0186004 A1 | 6/2016 | Hustad et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0293398 A1 | 10/2016 | Danek et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0352533 A1 | 12/2017 | Tois et al. |
| 2017/0352550 A1 | 12/2017 | Tois et al. |
| 2018/0233350 A1 | 8/2018 | Tois et al. |

FOREIGN PATENT DOCUMENTS

| | | |
|---|---|---|
| EP | 1340269 | 2/2009 |
| JP | 2011/0187583 | 9/2011 |
| JP | 2014/093331 | 5/2014 |
| KR | 102001001072 | 2/2001 |
| KR | 1020040056026 | 6/2004 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014/209390 | 12/2014 |
| WO | WO 2015/047345 | 4/2015 |
| WO | WO 2015/094305 | 6/2015 |
| WO | WO 2015/147843 | 10/2015 |
| WO | WO 2015/147858 | 10/2015 |
| WO | WO 2017/184357 | 10/2017 |
| WO | WO 2017/184358 | 10/2017 |

OTHER PUBLICATIONS

Au et al., "Selective Chemical Vapor Deposition of Manganese Self/Aligned Capping Layer for Cu Interconnections in Microelectronics", Journal of the Electrochemical Society, vol. 157, No. 6, 2010, pp. D341/D345.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2/857/C2/864.

Burton, et al., "Atomic Layer Deposition of MgO Using Bis(ethylcyclopentadienyl)magnesium and H20". J. Phys. Chem. C, 2009, 113, 1939/1946.

Burton, et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249/8257.

Carlsson, J., "Precursor Design for Chemical Vapour Deposition", Acta Chemica Scandinavica, vol. 45, 1991, pp. 864/869.

Chang et al, "Influences of damage and contamination from reactive ion etching on selective tungsten deposition in a low/pressure chemical/vapor/deposition reactor", J. Appl. Phys., vol. 80, No. 5, Sep. 1, 1996, pp. 3056/3061.

Chen et al., Highly Stable Monolayer Resists for Atomic Layer Deposition on Germanium and Silicon, Chem. Matter, vol. 18, No. 16, pp. 3733/3741, 2006.

Coclite, et al.; 25th Anniversary Article: CVD Polymers: A New Paradigm for Surface Modification and Device Fabrication; Advanced Materials; Oct. 2013; 25; pp. 5392/5423.

Elam et al., "Kinetics of the WF6 and Si2H6 surface reactions during tungsten atomic layer deposition", Surface Science, vol. 479, 2001, pp. 121/135.

Elam et al., "Nucleation and growth during tungsten atomic layer deposition on SiO2 surfaces", Thin Solid Films, vol. 386, 2001 pp. 41/52.

Ellinger et al., "Selective Area Spatial Atomic Layer Deposition of ZnO, Al2O3, and Aluminum-Doped ZnO Using Poly(vinyl pyrrolidone)", Chem Mater. 2014, 26:1514-1522.

Fabreguette et al., Quartz crystal microbalance study of tungsten atomic layer deposition using WF6 and Si2H6, Thin Solid Films, vol. 488, 2005, pp. 103/110.

Farm et al. Selective/Area Atomic Layer Deposition Using Poly( methyl methacrylate) Films as Mask Layers, J. Phys. Chem. C, 2008, 112, pp. 15791/15795. (Year: 2008).

Farr, Isaac Vincent; Synthesis and Characterization of Novel Polyimide Gas Separation Membrane Material Systems, Chapter 2; Virginia Tech Chemistry PhD Dissertation; URN # etd/080999/123034; Jul. 26, 1999.

George, Steven M.; Atomic Layer Deposition: An Overview; Chem. Rev. 2010, 110, pp. 111-131; Feb. 12, 2009.

Ghosal et al., Controlling Atomic Layer Deposition of Ti02 in Aerogels through Surface Functionalization, Chem. Matter, vol. 21, pp. 1989/1992, 2009.

Grubbs et al., "Nucleation and growth during the atomic layer deposition of W on Al2O3 and Al2O3 on W", Thin Solid Films, vol. 467, 2004, pp. 16/27.

Hymes et al., "Surface cleaning of copper by thermal and plasma treatment in reducing and inert ambients", J. Vac. Sci. Technol. B, vol. 16, No. 3, May/Jun. 1998, pp. 1107/1109.

(56) References Cited

OTHER PUBLICATIONS

International Search Report and Written Opinion dated Feb. 17, 2012 in Application No. PCT/US2011/039970, filed Jun. 10, 2011 in 12 pages.
International Search Report and Written Opinion dated Jun. 16, 2017 in Application No. PCT/US2017/026518, filed Apr. 7, 2017 in 13 pages.
International Search Report and Written Opinion dated Jun. 22, 2017 in Application No. PCT/US2017/026519, filed Apr. 7, 2017 in 12 pages.
International Search Report and Written Opinion dated Jun. 20, 2017 in Application No. PCT/US2017/026515, filed Apr. 7, 2017 in 11 pages.
King, Dielectric Barrier, Etch Stop, and Metal Capping Materials for State of the Art and beyond Metal Interconnects, ECS Journal of Solid State Science and Technology, vol. 4, Issue 1, pp. N3029/N3047, 2015.
Klaus et al., "Atomic layer deposition of tungsten using sequential surface chemistry with a sacrificial stripping reaction", Thin Solid Films, vol. 360, 2000, pp. 145/153.
Klaus et al., "Atomically controlled growth of tungsten and tungsten nitride using sequential surface reactions", Applied Surface Science 162/163, 2000, pp. 479/491.
Lee et al., Area-Selective Atomic Layer Deposition Using Self/Assembled Monolayer and Scanning Probe Lithography, Journal of the Electrochemical Society, vol. 156, Issue 9, pp. G125/G128, 2009.
Lei et al., "Real/time observation and opitimization of tungsten atomic layer deposition process cycle", J. Vac. Sci. Technol. B, vol. 24, No. 2, Mar./Apr. 2006, pp. 780/789.
Lemonds, A.M., "Atomic Layer Deposition and Properties of Refractory Transition Metal/Based Copper/Diffusion Barriers for ULSI Interconnect", The University of Texas at Austin, 2003, Dissertation in 216 pages.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490/498.
Liang, et al., "Growth of Ge Nanofilms Using Electrochemical Atomic Layer Deposition, with a "Bait and Switch" Surface/Limited Reaction". JACS, 2011, 133:8199-8204.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high/purity Pt nanostructures by combining electron beam induced deposition and atomic layer deposition, J Appl Phys., vol. 107, pp. 116102/1-116102/3, 2010.
Mackus, et al., The use of atomic layer deposition in advanced nanopatterning; Nanoscale (2014) 6:10941-10960.
Maluf et al., "Selective tungsten filling of sub/0.25μm trenches for the fabrication of scaled contacts and x/ray masks", J. Vac. Sci. Technol. B, vol. 8, No. 3, May/Jun. 1990, pp. 568-569.
Norrman, et al.; 6 Studies of Spin/Coated Polymer Films; Annu. Rep. Prog. Chem.; Sect. C; 2005; 101; pp. 174-201.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, 5:13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd/051799/162256; Apr. 26, 1999 in 29 pages.
Roberts et al., "Selective Mn deposition on Cu lines", poster presentation, 12th International Conference on Atomic Layer Deposition, Jun. 19, 2012, Dresden, Germany; in 1 page.
Sapp, et al.; Thermo/Mechanical and Electrical Characterization of Through/Silicon Vias with a Vapor Deposited Polyimide Dielectric Liner; IEEE; 2012.
Schmeißer, Decomposition of formic acid, Chemnitz University of Technology, pp. 1/13, Aug. 31, 2011.
Schmeißer, Reduction of Copper Oxide by Formic Acid an ab/initio study, Chemnitz University of Technology, pp. 1/42, Sep. 2011.
Schuisky, et al., Atomic Layer Deposition of Thin Films Using O2 as Oxygen Source; Langmuir (2001) 17:5508-5512.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601/1-010601/4, Jan. 2014.
Senesky et al., "Aluminum nitride as a masking material for the plasma etching of silicon carbide structures," 2010, IEEE, pp. 352/355.
Sundberg, et al.; Organic and Inorganic—Organic Thin Film Structures by Molecular Layer Deposition: A Review; Beilstein J. Nanotechnol; 2014, 5, pp. 1104-1136.
Suntola, "Handbook of Crystal Growth. vol. 3., Thin Films and Epitaxy, Part B: Growth mechanisms and Dynamics", Amsterdam: North Holland, Elsevier Science Publishers (1994), Chapter 14, pp. 601-662.
Toirov, et al.; Thermal Cyclodehydration of Polyamic Acid Initiated by UV/Irradiation; Iranian Polymer Journal; vol. 5, No. 1; pp. 16/22; 1996; Iran.
Vallat et al., Selective deposition of Ta2O5 by adding plasma etching super/cycles in plasma enhanced atomic layer deposition steps, Journal of Vacuum Science & Technology A, vol. 35, No. 1, pp. 01B104/1-01B104/7, Jan. 2017.
Vervuurt et al. "Area/selective atomic layer deposition of platinum using photosensitive polymide," (2016) Nanotechnology 27.40 (2016): 405302.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Zhou, et al.; Fabrication of Organic Interfacial Layers by Molecular Layer Deposition: Present Status and Future Opportunities; Journal of Vacuum Science & Technology; A 31 (4), 040801/1 to 040801/18; 2013.

* cited by examiner

METHOD OF FORMING A DIRECTED SELF-ASSEMBLED LAYER ON A SUBSTRATE

CROSS-REFERENCE TO RELATED APPLICATION

This application is related to U.S. Non-Provisional patent application Ser. No. 15/132,084, filed Apr. 18, 2016 and entitled "COMBINED ANNEAL AND SELECTIVE DEPOSITION SYSTEMS," and U.S. Non-Provisional patent application Ser. No. 15/132,091, filed Apr. 18, 2016 and entitled "COMBINED ANNEAL AND SELECTIVE DEPOSITION PROCESS," the disclosures of which are hereby incorporated by reference in their entireties.

FIELD

The present invention may relate to a method of forming a directed self-assembled (DSA) layer on a substrate. The method may for example comprise: providing a substrate; applying a layer comprising a self-assembly material on the substrate; and annealing the self-assembly material of the layer to form a directed self-assembled layer by providing a controlled temperature and gas environment around the substrate.

BACKGROUND

Semiconductor devices have been pushed to smaller and smaller sizes. Different patterning techniques have been developed to allow for these smaller sizes. These techniques include spacer defined quadruple patterning, extreme ultraviolet lithography (EUV), and Spacer Defined Double patterning. These approaches have allowed production of sub-25 nm resolution patterns on semiconductor devices.

Directed self-assembly (DSA) has been considered as an option for future lithography applications. DSA may involve the use of block copolymers to define patterns for self-assembly. The block copolymers may include poly(methyl methacrylate) (PMMA), or polystyrene (PS), such as for example poly(styrene-block-methyl methacrylate) (PS-b-PMMA). Other block copolymers may include emerging "high-Chi" polymers, which may potentially enable small dimensions.

Block copolymers may phase separate under certain conditions to form periodic nanostructures, as in PS-b-PMMA. Phase separation is a situation similar to that of oil and water. Oil and water are immiscible because they phase separate. Due to incompatibility between the blocks, block copolymers may undergo phase separation. Because the incompatible blocks are covalently bonded to each other, they cannot separate macroscopically. During "phase separation" the blocks form nanometer-sized structures in which the incompatible blocks are separated maximally while still being covalently bonded to each other, while the compatible blocks may group maximally together by finding similar neighboring blocks. Depending on the relative lengths of each block, several structures may be obtained.

DSA may be used, for example to form parallel lines and spaces structures or regular arrays of holes with very small pitch and critical dimensions. In particular, DSA can define sub-25 nm resolution patterns through self-assembly, while guided by surface topography and/or surface chemical patterning.

A drawback of DSA may be that the obtained structure of parallel lines or array of holes may have some defects at random locations. The defects may be caused by a not sufficient phase separation (e.g. self-assembly) in the anneal step.

For an array of lines the defects may be defined, for example, by bridges when two parallel lines which are perfectly phase separated both are interrupted at the same location by a not phase separated area (bridge) or further by a dislocation where the parallel configurations of the lines is distorted at a certain location.

SUMMARY

It is an objective, for example, to provide an improved or at least an alternative method of forming a directed self-assembled (DSA) layer on a substrate.

Accordingly, there may be provided in an embodiment a method of forming a directed self-assembled (DSA) layer on a substrate comprising: providing a substrate; applying a layer comprising a self-assembly material on the substrate; and annealing the self-assembly material of the layer to form a directed self-assembled layer by providing a controlled temperature and gas environment around the substrate, wherein the method comprises controlling the controlled gas environment to comprise molecules comprising an oxygen element with a partial pressure of 10-2000 Pa.

By annealing the self-assembly material of the layer to form a directed self-assembled layer in a controlled temperature and gas environment around the substrate, wherein the method comprises controlling the controlled gas environment to comprise molecules comprising an oxygen element with a partial pressure between 10-2000 Pa, preferably between 50-1000 Pa, and most preferably between 200-500 Pa, the number of defects in the directed self-assembled layer may be reduced.

According to a further embodiment there is provided an apparatus constructed and arranged to form a directed self-assembled (DSA) layer on a substrate, the apparatus comprising: a reaction chamber, the reaction chamber constructed and arranged to hold the substrate; a heating element configured to perform an annealing of the layer on the substrate; and a gas control system to control the gas environment around the substrate in the reaction chamber, wherein the method comprises controlling the controlled gas environment to comprise molecules comprising an oxygen element with a partial pressure of 10-2000 Pa.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWINGS

These and other features, aspects, and advantages of the invention disclosed herein are described below with reference to the drawings of certain embodiments, which are intended to illustrate and not to limit the invention.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Figure 1:
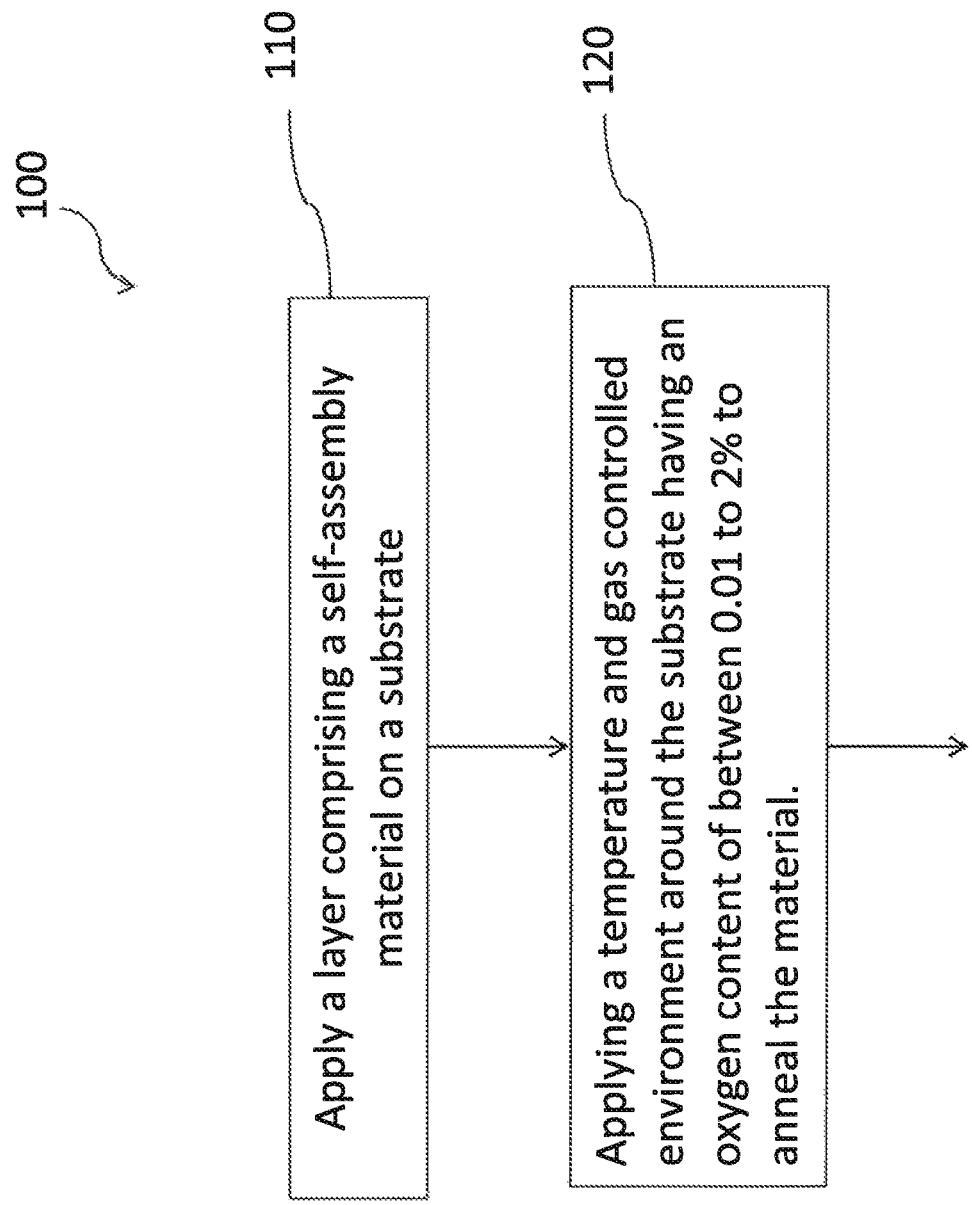
FIG. 1 is a flowchart of a method in accordance with at least one embodiment of the invention; and, FIG. 2 is a graph showing the defect density per square cm after an annealing method according to the invention.

FIG. 1 illustrates a method 100 in accordance with at least one embodiment of the invention. The method 100 includes a first step 110 of providing a substrate e.g. a wafer with a self-assembly material in a processing chamber. The wafer may have at least a DSA self-assembly material comprising PMMA, and polystyrene (PS), among other polymers. The processing chamber may be a batch reactor or a cluster tool with two batch reactors. One example of a potential processing chamber may include an A412 system from ASM International N.V., which may run in two reactor chambers the same process or run two different processes independently or sequentially.

The method 100 may include a second step 120 of performing a self-assembly anneal of the DSA polymers. The purpose of the annealing process is to incite the self-assembly e.g. self-organization in the DSA polymers e.g. the block copolymer. In other words, parallel lines or grids of holes in the polymers may be formed as directed by guidance structures on the substrate. In accordance with at least one embodiment of the invention, this may mean that domains of PMMA and domains of PS may be formed in an alternating manner. The benefits achieved by the self-assembly anneal may include improvement of the self-assembly process, reduction of defects, improved line edge/width roughness, and improved critical dimension (CD) uniformity. Additionally, the anneal of the second step 120 may have a purpose of degassing moisture or other contaminants from the polymer, hardening the polymer, or selectively burning away one of the polymer types from the substrate surface.

In order to reach a low defect density in the obtained pattern, process parameters, such as the time, temperature, and the ambient conditions and pressure of the annealing process, are critical. A long annealing time may be needed to obtain a low defect density. The anneal may be accomplished by providing a controlled temperature environment around the wafer with a temperature ranging between 100° C. and 400° C., preferably between 200° C. and 300° C., and most preferably about 250° C. The anneal may take place in between a quarter of an hour and four hours, preferably in between half an hour and two hours and most preferably about one hour. Other temperatures and durations are possible depending on the speed of the phase separation. However, the temperature of the self-assembly anneal should not be increased too high or the polymers may start to decompose.

The annealing may be accomplished in a controlled gas environment around the wafer, which may comprise nitrogen, argon, helium, hydrogen, oxygen, nitrous oxide, ozone, water vapor, solvent vapors, or mixtures of these gases.

By annealing of the self-assembly material to form a directed self-assembled layer in a controlled temperature and gas environment around the substrate, whereby the controlled gas environment is controlled to comprise molecules comprising an oxygen element with a partial pressure between 10-2000 Pa, preferably between 50-1000 Pa and most preferably between 200-500 Pa the number of defects in the directed self-assembled layer is reduced. The annealing is configured to induce directed self-assembly within the self-assembly material.

The molecules comprising the oxygen element may be selected from the group comprising oxygen ($O_2$), water ($H_2O$), and nitrous oxide ($N_2O$).

The controlled gas environment may comprise at least an inert gas, such as, for example, nitrogen ($N_2$), argon (Ar), or helium (He).

The annealing and the film deposition may take place within different reaction chambers located on the same cluster tool or may be performed in different reaction chambers of different tools. The reaction chamber may be a batch system for processing substrates. The reaction chamber may be configured to process multiple substrates.

Applying the layer and annealing the layer may take place within a single reaction chamber. Applying the layer and annealing the layer may take place within different reaction chambers located in the same tool. The reaction chamber may be a batch system for processing substrates. The reaction chamber may be configured to process multiple substrates.

The pressure of the anneal environment can be any pressure in the range from ultra-high vacuum to atmospheric pressure or even above atmospheric pressure.

In accordance with one embodiment of the invention, the annealing process may take place on a single wafer hot plate. In accordance with another embodiment of the invention, a batch reactor may prove to be beneficial for processes needing a substantial anneal time. The batch reactor may hold between 2 and 250 substrates, preferably between 5 and 150 substrates, or most preferably about 100 substrates. For example, the A412 may be operated such that one reactor may be used for the anneal. This may enable to perform long anneals in the order of 1-2 hours in a cost effective way.

Figure 2:
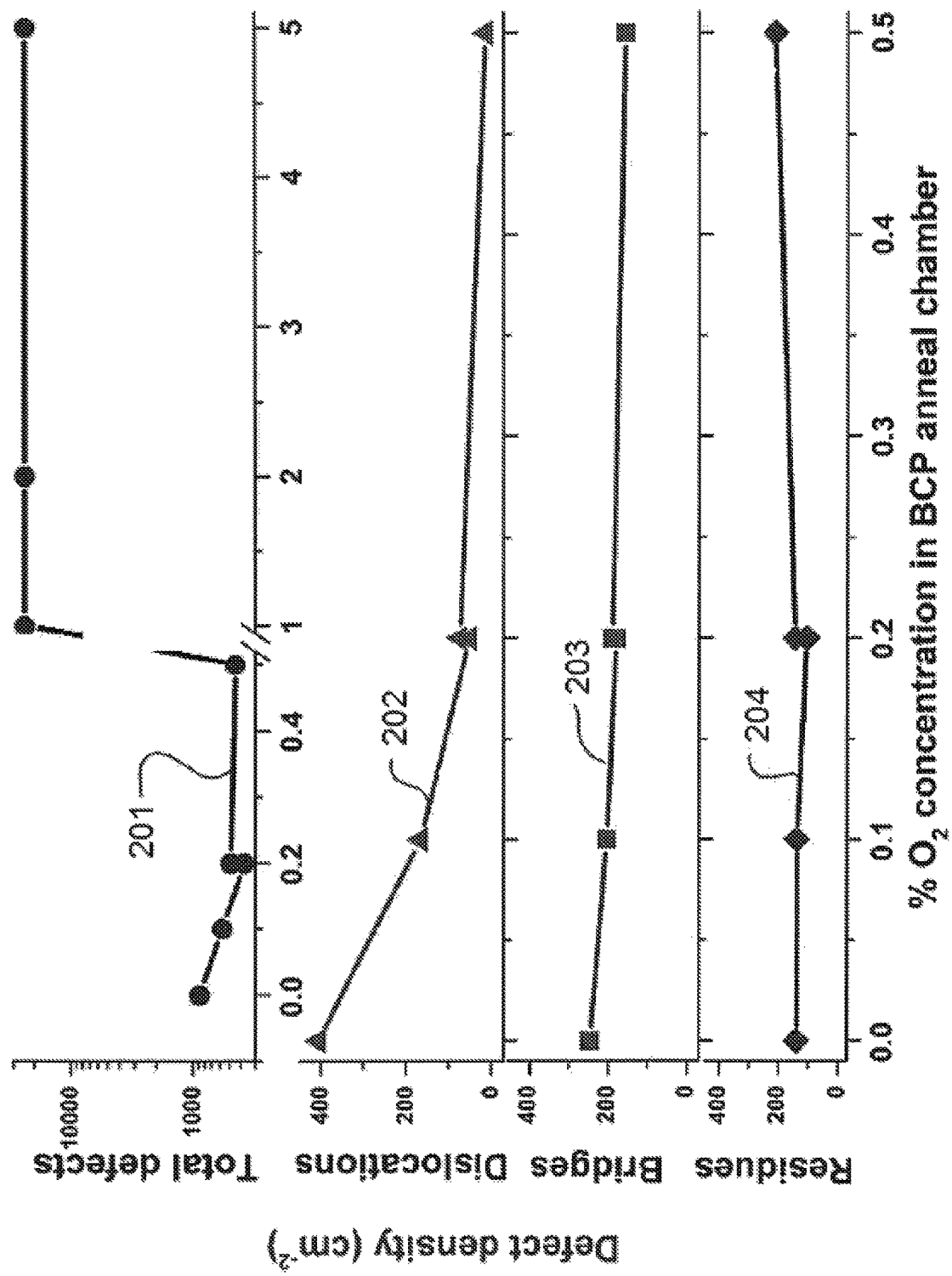

FIG. 2 is a graph showing the defect density per square cm after an annealing method according to the invention. FIG. 2 depicts the number of defects on the Y-axis as a function of the concentration of a molecule comprising an oxygen element e.g. oxygen on the X axis. The line 201 depicts the total number of defects per square centimeter as a function of the oxygen concentration during anneal. The line 202 depicts the total number of dislocations per square centimeter as a function of the oxygen concentration during anneal. The line 203 depicts the total number of bridges per square centimeter as a function of the oxygen concentration during anneal. The line 204 depicts the total number of residues per square centimeter as a function of the oxygen concentration during anneal. The figures may show that a concentration of between 0.01% to 2%, corresponding to a partial pressure between 10-2000 Pa, preferably between 0.05% to 1%, corresponding to a partial pressure between 50-1000 Pa and most preferably between 0.2% to 0.5%, corresponding to a partial pressure between 200-500 Pa of oxygen during anneal may reduce the defects in this experiment.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

What is claimed is:

1. A method of forming a directed self-assembled (DSA) layer on a substrate comprising:
   providing a substrate;
   applying a layer comprising a self-assembly material on the substrate;
   annealing the self-assembly material of the layer to form a directed self-assembled layer by providing a controlled temperature and controlled gas environment around the substrate; and
   controlling the controlled gas environment to comprise vapor phase oxidant compound(s) with a partial pressure in a range of about 10-2000 Pa.

2. The method of claim 1, wherein the partial pressure is in a range of about 50-1000 Pa.

3. The method of claim 1, wherein the partial pressure is in a range of about 200-500 Pa.

4. The method of claim 1, wherein the vapor phase oxidant compound(s) include compounds selected from the group comprising oxygen ($O_2$), water ($H_2O$), and nitrous oxide ($N_2O$).

5. The method of claim 1, wherein the method comprises controlling the controlled gas environment to comprise an inert gas.

6. The method of claim 5, wherein the inert gas comprises nitrogen ($N_2$), argon (Ar), or helium (He).

7. The method of claim 1, wherein during annealing, the controlled temperature is controlled to a range between 100° C. and 400° C.

8. The method of claim 7, wherein during annealing, the controlled temperature is controlled to a range between 200° C. and 300° C.

9. The method of claim 1, wherein the self-assembly material comprises a diblock copolymer wherein at least 1 of the blocks comprises polystyrene or PMMA.

10. The method of claim 9, wherein the diblock copolymer comprises a poly(styrene-block-methyl methacrylate) (PS-b-PMMA).

11. The method of claim 1, wherein the annealing and the film deposition take place within different reaction chambers located on the same cluster tool.

12. The method of claim 11, wherein the reaction chamber is a batch system for processing substrates.

13. The method of claim 11, wherein the reaction chamber is configured to process multiple substrates.

14. The method of claim 1, wherein the annealing is configured to induce directed self-assembly within the self-assembly material.

15. The method of claim 1, wherein the controlled temperature is at least 25° C. higher than a temperature of the substrate during applying the film.

16. The method of claim 15, wherein the temperature of the annealing step is 25-300° C. higher than the temperature of the substrate during applying the film.

17. The method of claim 16, wherein the temperature of the annealing step is 100-250° C. higher than the temperature of the substrate during the applying the film.

18. The method of claim 1, wherein applying the layer and annealing the layer take place within a single reaction chamber.

19. The method of claim 1, wherein applying the layer and annealing the layer take place within different reaction chambers located in the same tool.

20. The method according to claim 1, wherein the method comprises pre-annealing the self-assembly material on the substrate before annealing the self-assembly material by providing a pre-anneal controlled temperature and pre-anneal controlled gas environment around the substrate, controlling the pre-anneal controlled gas environment to comprise vapor phase oxidant compound(s) with a partial pressure in a range of about 10-2000 Pa.

21. The method according to claim 1, wherein the controlled gas environment has a pressure around 100.000 Pa.

22. An apparatus constructed and arranged to form a directed self-assembled (DSA) layer on a substrate, the apparatus comprising:
   a reaction chamber, the reaction chamber constructed and arranged to hold the substrate comprising a self-assembly material on the substrate;
   a heating element configured to perform an annealing of the self-assembly material on the substrate; and
   a gas control system configured to control the gas environment around the substrate in the reaction chamber to comprise vapor phase oxidant compound(s) with a partial pressure in a range of about 10-2000 Pa.

23. The apparatus of claim 22, wherein the heating element is constructed and arranged to control the temperature during annealing to a range between 100° C. and 400° C.

24. The apparatus of claim 23, wherein the temperature during annealing is between 200° C. and 300° C.

* * * * *

UNITED STATES PATENT AND TRADEMARK OFFICE
CERTIFICATE OF CORRECTION

| | | |
|---|---|---|
| PATENT NO. | : 10,551,741 B2 | Page 1 of 1 |
| APPLICATION NO. | : 16/094119 | |
| DATED | : February 4, 2020 | |
| INVENTOR(S) | : Werner Knaepen | |

It is certified that error appears in the above-identified patent and that said Letters Patent is hereby corrected as shown below:

In the Claims

Column 6, Line 26 (Approx.), Claim 17, after "during" delete "the".

Signed and Sealed this
Fifth Day of May, 2020

Andrei Iancu
*Director of the United States Patent and Trademark Office*